United States Patent
Houston

(12) United States Patent <br>
Houston

(10) Patent No.: US 6,734,521 B2 <br>
(45) Date of Patent: May 11, 2004

(54) INTEGRATED CIRCUIT CELLS

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/233,352

(22) Filed: Aug. 30, 2002

(65) Prior Publication Data

US 2004/0041228 A1 Mar. 4, 2004

(51) Int. Cl.[7] .............................................. H01L 29/00
(52) U.S. Cl. ...................... 257/500; 257/401
(58) Field of Search ................ 257/401, 500

(56) References Cited

U.S. PATENT DOCUMENTS

| | | | | |
|---|---|---|---|---|
| 5,847,432 A | * | 12/1998 | Nozaki | 257/369 |
| 6,238,982 B1 | * | 5/2001 | Krivokapic et al. | 438/275 |
| 6,369,412 B1 | * | 4/2002 | Ueda et al. | 257/206 |
| 6,518,592 B1 | * | 2/2003 | Amishiro et al. | 257/48 |
| 6,542,005 B2 | * | 4/2003 | Yamamoto | 326/93 |
| 2002/0056885 A1 | * | 5/2002 | Kita et al. | 257/499 |
| 2002/0074572 A1 | * | 6/2002 | Shinozaki et al. | 257/203 |
| 2002/0085409 A1 | * | 7/2002 | Houston | 365/154 |
| 2002/0153559 A1 | * | 10/2002 | Yeap et al. | 257/335 |

* cited by examiner

*Primary Examiner*—George Eckert <br>
(74) *Attorney, Agent, or Firm*—Rose Alyssa Keagy; W. James Brady, III; Frederick J. Telecky, Jr.

(57) ABSTRACT

According to one embodiment of the invention, a method for designing an integrated circuit is provided. The method includes providing a first transistor in a first logic path. The first transistor has a first contact, a first gate length and a first contact to gate centerline spacing. The method also includes providing a second transistor in a second logic path. The second transistor has a second contact, a second gate length and a second contact to gate centerline spacing. The first contact to gate centerline spacing is substantially equal to the second contact to gate centerline spacing. The method also includes selecting a different gate length for the first gate length using a predetermined design criterion.

9 Claims, 3 Drawing Sheets

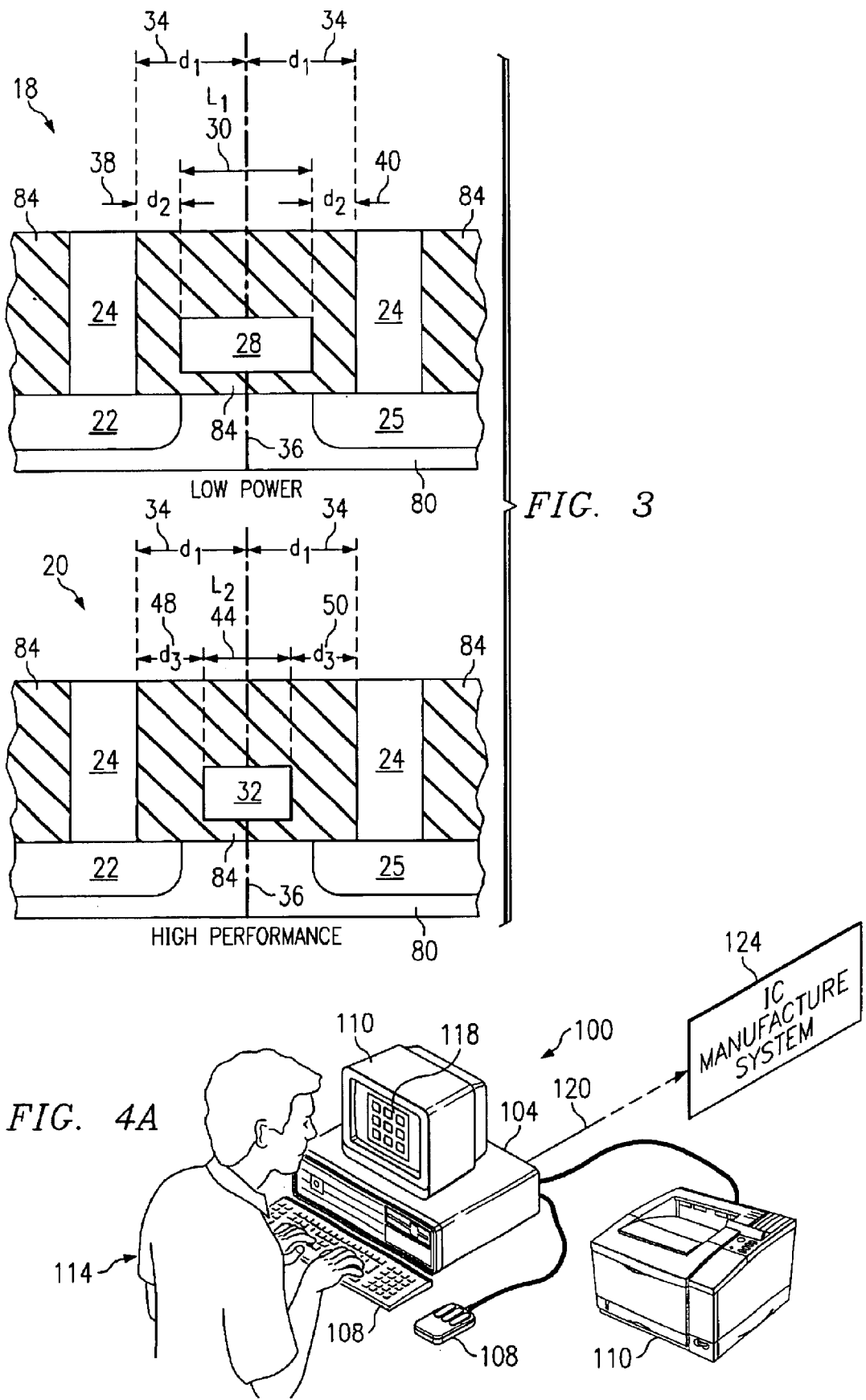

INTEGRATED CIRCUIT CELLS

This application is related to U.S. patent application Ser. No. 10/028,199 filed Dec. 20, 2001 entitled "Static Random Access Memory Method". With its mention in this section, this patent application is not admitted to be prior art with respect to the present invention.

TECHNICAL FIELD OF THE INVENTION

This invention relates generally to the field of integrated circuit design and more particularly to integrated circuit cells.

BACKGROUND OF THE INVENTION

Reduction of quiescent leakage current ("IDDQ") in integrated circuits ("IC"), such as an application specific integrated circuit ("ASIC"), is one goal of integrated circuit design because such a reduction lowers the overall power consumption of the IC. However, implementing features in cells of the IC to reduce the IDDQ also degrades the performance of the cells. Because of the performance degradation, these cells, referred to as "low power cells," are positioned in electrical paths of the IC where the importance of performance is relatively low. Such selective use of low power cells in an IC reduces IDDQ, which lowers the overall power consumption of the IC without sacrificing the overall performance of the IC.

Conventionally, one feature that distinguishes a low power cell from other cells, such as high performance cells, is a larger cell footprint. The footprint is larger because a low power cell has a gate that is longer than the gate of a high performance cell, which requires the contacts of the low power cell to be further apart from each other. Because of the larger footprint, low power cells may not be used in combination with high performance cells in certain ICs. For example, an ASIC, which requires its cells to have a uniform footprint, cannot benefit from the selective use of low power cells.

SUMMARY OF THE INVENTION

According to one embodiment of the invention, a method for designing an integrated circuit is provided. The method includes providing a first transistor in a first logic path. The first transistor has a first contact, a first gate length and a first contact to gate centerline spacing. The method also includes providing a second transistor in a second logic path. The second transistor has a second contact, a second gate length and a second contact to gate centerline spacing. The first contact to gate centerline spacing is substantially equal to the second contact to gate centerline spacing. The method also includes selecting a different gate length for the first gate length using a predetermined design criterion.

Some embodiments of the invention provide numerous technical advantages. Some embodiments may benefit from some, none, or all of these advantages. For example, according to one embodiment, an integrated circuit having a combination of high performance and low power cells may be designed or manufactured using a same footprint, which simplifies the design and manufacturing processes. According to another embodiment, an integrated circuit that requires the use of a same cell footprint, such as an application specific integrated circuit, may have a combination of high performance cells and low power cells, which reduces the power consumption level of the integrated circuit. According to another embodiment, the process of switching a high performance to a low power cell, or vice versa, is simplified. According to another embodiment, late substitution of cells during an IC design process made possible.

Other technical advantages may be readily ascertain by one of skill in the art.

BRIEF DESCRIPTION OF THE DRAWINGS

Reference is now made to the following description taken in conjunction with the accompanying drawings, wherein like reference numbers represent like parts, in which:

FIG. 3 is a schematic cross-sectional diagram illustrating one embodiment of the lower power cell and high performance cell shown in FIG. 2;

FIG. 4A is a schematic diagram illustrating one embodiment of a system that may be used to design and manufacture the integrated circuit having one or more sets of the cells shown in FIGS. 2 and 3;

DETAILED DESCRIPTION OF EXAMPLE EMBODIMENTS OF THE INVENTION

Embodiments of the invention are best understood by referring to FIGS. 1 through 5 of the drawings, like numerals being used for like and corresponding parts of the various drawings.

Figure 1:
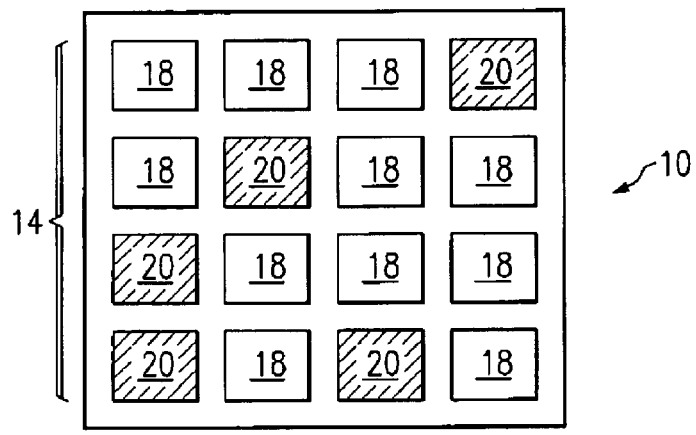
FIG. 1 is a block diagram of an integrated circuit having a plurality of cells according to one embodiment of the present invention.

FIG. 1 illustrates a block diagram of an embodiment of an integrated circuit 10 having a plurality of cells 14. A "cell" refers to a specific layout of a set of elements, such as an interconnection of transistors to perform a logic function. A cell may include one or more transistors. Examples of cells 14 include a 3-input NAND or a flip-flop. Each cell 14 may have different levels of performance and leakage current. For example, as illustrated in FIG. 1, cells 14 may include low power cells 18 and high performance cells 20. A "low power cell," such as low power cell 18, is a cell that has one or more features for reducing quiescent leakage current ("IDDQ") in exchange for degraded performance of the cell. An example of such a feature is a gate having a relatively longer length, which narrows the gate-to-contact spaces of the cell. Providing a longer gate length for the cell lowers IDDQ of the cell. A "high performance cell," such as high performance cell 20, has a higher level of IDDQ but maintains a higher performance level than that of lower power cell 18. High performance cell 20 has wider gate-to-contact spaces because it has a gate having a relatively shorter length. Because high performance cell 20 allows a faster transmission of data or signal over a particular electrical path of integrated circuit 10, high performance cells 20 are generally placed on electrical paths where speed is critical. Such paths, which are not explicitly shown, are referred to as "critical paths." In designing and manufacturing integrated circuit 10, positioning high performance cells 20 on critical paths while positioning low power cells 18 on non-critical paths may lower the power consumption level of integrated circuit 10 without substantially affecting the overall performance of integrated circuit 10.

Conventionally, the design and manufacture of a low power cell requires the use of a cell footprint that is larger than the footprint of a high performance cell because of the low power cell's longer gate. A "footprint" refers to the size of cell 14. When converting an existing high performance cell to a lower power cell during the design and manufacture processes, the cell footprint of the existing high performance cell is enlarged during the conversion because contacts of the high performance cell may be moved farther apart from each other to widen the gap between the contacts so that a longer gate may be positioned between the contacts. Such movement of contacts may require relocation of contacts to another grid of the design rule, thus changing the cell footprint. The enlargement of a cell footprint may be relevant in certain IC design methodologies where there are restrictions on the cell footprint. For example, there may be restrictions on the height of cell 14 to conform to set routing grids. Changing cell footprint to accommodate a longer gate length for low power cell 18 is not compatible with these design methodologies because cells with different heights would not fit together. To improve flexibility in IC design, it is desirable to have low power cells 18 and high performance cells 20 that have the same function to also have the same footprint so that one may be substituted for another without disrupting the total layout. This may be necessary because the critical paths may not be determined until layout is complete to the extent that routing delays can be determined. The determination of critical paths and the substitution of high performance cells 20 for low power cells 18, or vice-versa, may be an iterative process. In some embodiments, this may be done with increased efficiency if cells 14 can be substituted without disruption of the layout. Furthermore, the requirement to use different size footprints makes it difficult and costly to change from a low power cell, such as low power cell 18, to a high performance cell, such as high performance cell 20, or vice versa, because such a change may require a rearrangement of other cells 14.

According to some embodiments of the present invention, a method, apparatus, and system are provided that allow low power cells 18 to have same footprints as high performance cells 20. This is advantageous in some embodiments of the invention because only cells meeting some restriction in footprint (for example, having a cell height compatible with the routing grid) may be used together in certain integrated circuits, such as an ASIC. According to another embodiment, the process of switching a high performance to a low power cell, or vice versa, is simplified. According to another embodiment, the use of low power cells decreases overall power consumption level of certain integrated circuits, such as ASIC. According to another embodiment, late substitution of cells during an IC design process is made possible, which improves design flexibility. Additional details of example embodiments of the invention are described in greater detail below in conjunction with portions of FIG. 1 and FIGS. 2 through 5.

Referring back to FIG. 1, in one embodiment, each cell 14 operable to perform a same function is given a same cell footprint by making the distance between the respective gate centerlines and contacts substantially the same for all cells 14. Then, in one embodiment, the gate length is adjusted to make a selected cell either a high performance cell or low power cell. In one embodiment where an Application Specific Integrated Circuit ("ASIC") system comprising a library of high performance cells 20 and low power cells 18 having the same function and a substantially same footprint is used for IC design, cell 14 is substituted for high performance cell 20 or low power cell 18 to adjust the gate length of cell 14. In some embodiments, the selection of certain cells 14 depends on whether the selected cell 14 is on a critical path of integrated circuit 10; however, the selection may depend on other design criteria of integrated circuit 10.

Figure 2:
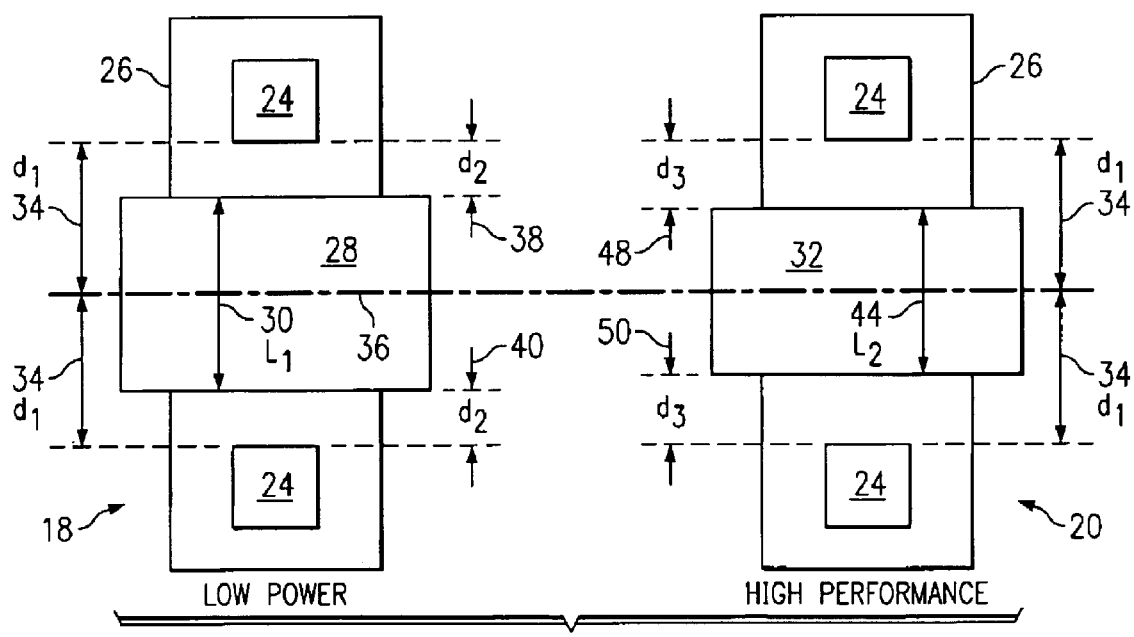
FIG. 2 is a schematic diagram illustrating one embodiment of a low power cell and a high performance cell of the integrated circuit shown in FIG. 1.

FIG. 2 is a schematic diagram illustrating additional details of one embodiment of low power cell 18 and one embodiment of high performance cell 20. In some embodiments, low power cell 18 has two contacts 24 that are positioned in an active region 26, such as a moat. Although FIG. 2 shows one embodiment of low power cell 18 having two contacts 24, low power cell 18 may have more contacts 24 in some embodiments. Low power cell 18 also includes a gate 28 having a gate length 30, shown as $L_1$, and a centerline 36. Centerline 36 is positioned approximately in the middle of gate length 30, as shown in FIG. 1. Gate 28 is positioned approximately between contacts 24 of low power cell 18. A distance 34 between one contact 24 and center 36 is shown as $d_1$ and referred to herein as contact-to-centerline distance 34. Gate-to-contact spaces 38 and 40 are defined by respective contacts 24 and gate 28. In one embodiment, gate 28 is positioned between contacts 24 so that gate-to-contact distances 38 and 40 are equal. Gate-to-contact distances 38 and 40 are each shown as $d_2$.

High performance cell 20 comprises contacts 24 positioned in active region 26. High performance cell 20 has the same contact-to-centerline distance 34 as contact-to-centerline distance 34 of low power cell 18. As such, contact-to-centerline distance 34 of high performance cell 20 is also shown as $d_1$. High performance cell 20 also includes a gate 32 having a gate length 44, shown as $L_2$, and same centerline 36 as centerline 36 of low power cell 18. Centerline 36 of gate 32 is positioned approximately in the middle of gate length 44, Centerline 36 of gate 32 is positioned approximately between contacts 24 of high performance cell 20. Gate length 44 of gate 32 is shorter than gate length 30 of gate 28. Gate 32 is positioned between contacts 24 of high performance cell 20. Gate-to-contact spaces 48 and 50 are defined by respective contacts 24 of high performance cell 20 and gate 32. In one embodiment, gate 32 is positioned between contacts 24 so that gate-to-contact distances 48 and 50 are equal. Gate-to-contact distances 48 and 50 are each shown as $d_3$. Gate-to-contact spaces 48 and 50 are wider than the respectively corresponding gate-to-contact distances 38 and 40 of low power cell 18 because of shorter gate length 44.

FIG. 3 is a schematic cross-sectional diagram illustrating one embodiment of cells 18 and 20 shown in FIG. 2. Low power cell 18 comprises a substrate layer 80 and a dielectric layer 84 that overlies substrate layer 80. Contacts 24 are separated from each other by contact-to-centerline distances 34 and overlie either a source 22 or a drain 25. Gate 28 is disposed between contacts 24 and is separated from respective contacts 24 by gate-to-contact distances 38 and 40. High performance cell 20 comprises substrate layer 80 and dielectric layer 84 that overlies substrate layer 80. Contacts 24 overlie either source 22 or drain 25 and are separated by the same contact-to-centerline distances 34 as contact-to-centerline distances 34 of low power cell 18. Gate 32 has a shorter gate length 44 than gate length 30 of gate 28. As such, gate-to-contact distances 48 and 50 are wider than the corresponding gate-to-contact distances of 38 and 40, respectively.

Referring again to FIGS. 1 and 2, each cell 14 is given a same cell footprint by making distance 34 between its contacts 24 substantially the same for all cells 14. In one embodiment, all of cells 14 are initially laid out as low power cells 18. Then some of cells 18 on critical paths (not explicitly shown) of integrated circuit 10 are identified for conversion into high performance cells 20; however, depending on the design criteria of integrated circuit 10, other cells 1B may be identified for conversion into high performance cells 20. Then, for each identified cell 18, gate length 30 is reduced to increase gate-to-contact spaces 38 and 40 to equal gate-to-contact spaces 48 and 50 without moving contacts 24 of identified cell 18. The reduction of gate length 30 converts selected cell 18 into high performance cell 20 because the widening of gate-to-contact space increases the performance level of the identified cells 18.

In one embodiment, all of cells 14 are initially laid out as high performance cells 20. Then some of cells 20 on non-critical paths (not explicitly shown) of integrated circuit 10 are identified for conversion into low power cells 18; however, depending on the design criteria of integrated circuit 10, other cells 20 may be identified for conversion into low power cells 18. Then, for each identified cell 20, gate length 44 is increased to decrease gate-to-contact spaces 48 and 50 to equal gate-to-contact spaces 38 and 40 without moving contacts 24 of identified cell 20. The increase of gate length 44 converts identified cell 20 into low power cell 18 because the increase of gate length reduces IDDQ of the identified cells 20. In some embodiments, the reduction of performance of selected cells 20 does not substantially affect the overall performance level of integrated circuit 10 because the converted cells 18 are on non-critical paths of integrated circuit 10.

In some embodiments where multiple gates 28 or 32 are in one cell 14, respective gate lengths 28 or 32 may be adjusted independently depending on whether the gate 28 or 32 is on a critical path or a non-critical path of integrated circuit 10. For example, the rising edge of an input to the cell may be on critical path while the falling edge of the input signal is not on critical path.

Where an ASIC system comprising a library of characterized cells is used in designing IC 10, models of high performance cells 20 and low power cells 18 may be included in the library. In this embodiment, high performance cells 20 and low power cells 18 perform the same logic functions as each other and have substantially the same cell footprint. Thus, the included cells 18 and 20 may be substituted one for the other because cells 18 and 20 have substantially the same footprint. In one embodiment, the ASIC system automatically models a substitution of cell 14 for either high performance cell 20 or low power cell 18, depending on the design specifications of IC 10. In one embodiment, a user of the ASIC system may substitute a model of cell 14 for a model of either high performance cell 20 or low power cell 18, depending on the design specifications of IC 10. In such embodiments, the adjustment of a gate length of an identified cell is performed by selecting a cell model from the library with an appropriate gate length and substituting the model of the identified cell with the selected cell model.

In some embodiments, each cell 14 has extra space between respective centerlines 36 and contacts 24 so that both longer and shorter gates may be positioned between contacts 24 while maintaining the same cell footprint for all cells 14. The extra space for contact-to-centerline distance 34 may be provided by a number of different ways. For example, in some embodiments of the invention, the size of the cell footprint of all cells 14 may be increased. In one embodiment, contacts 24 of cell 14 may be separated far enough at the initial layout of cells 14 so that a longer gate, such as gate 28, may be positioned between the contacts 24. The extra space between contacts 24 allows cell 14 to become either low power cell 14 having longer gate 28 or high performance cell 20 having shorter gate 32 without moving contacts 24. In another embodiment of the invention, the difference between the layout drawing grid and the final on-chip grid may be used as the extra space between contacts 24. When the gate-to-contact spacing rule is larger than the actually manufactured integrated circuit 10, the extra gate-to-contact space that results from the difference in grid sizes may be used to position longer gate 28 between contacts 24.

In some embodiments, contacts 24 are placed on a grid that is coarser than the grid for adjustment of gate length. For example, contacts 24 may be placed on a 10 nm grid while the length of a gate, such as gates 28 or 32, is adjusted on a 1 nm grid. Additionally, there may be a lower limit on gate-to-contact spaces, such as gate-to contact spaces 38, 40, 48, or 50, for manufactureability. With the gate length adjustment on a finer grid than the contact placement, there may be a range of gate lengths that will have the same minimum spacing of contacts placed on opposite sides of the gate. If this range of gate lengths encompasses the lengths to be used for both the low power and high performance cells, there is no loss in area efficiency in having contacts 24 spaced to accommodate longer gate length 30 compared to shorter gate length 44. That is, contacts 24 may be placed at minimum spacing for high performance gate length 44, as restricted by the contact placement grid, and still accommodate longer low power gate length 30 without violating the minimum gate to contact spacing for manufactureability.

In another embodiment, the extra space may be found in design and manufacturing processes where the design rule that is used for a base line process of integrated circuit design is also used for the high performance process of the integrated circuit design. The extra space for contact-to-centerline distance 34 is available because the design rule is set to accommodate the longer gate length from the beginning of the design process and the same, larger design rule is also used for the high performance process. In another embodiment, the size of the design rule grid may be used to provide the extra space without moving contacts 24. For example, when the grid is 5 nanometers in length, gate 32 may be increased in length by 6 nanometers without moving contacts 24 because gate 32 may be increased on both ends by 3 nanometers (resulting in a total increase in length by 6 nanometers) without exceeding the size of one grid. Thus, contacts 24 need not be moved, preserving the original cell footprint. This is advantageous in some embodiments of the invention because there is no sacrifice of cell area during the integrated circuit design. Gate length, such as gate length 44, may be increased by a greater amount depending on the size of a particular grid.

FIG. 4A is a schematic diagram illustrating one embodiment of a system 100 that may be used to design and manufacture an integrated circuit, such as integrated circuit 10 shown in FIG. 1, according to one embodiment of the present invention. System 100 includes a computer 104 that is coupled to one or more input devices 108 and one or more output devices 110. A user 114 has access to system 100 and may utilize input devices 108 to input data and generate and edit a model 118 of integrated circuit 10. Model 118 may be displayed by any or all of output devices 110. Computer 104 is also coupled to an integrated circuit manufacturing system 124 by a link 120. System 124 is operable to manufacture an integrated circuit, such as integrated circuit 10, according to model 118. System 124 is currently available and commonly used to manufacture an integrated circuit. Although some embodiments of the invention make use of system 124, the details of system 124 are not described here because they are well-known in the art.

As shown in FIG. 4A, examples of input device 108 are a keyboard and a mouse; however, input device 108 may take other forms, including a stylus, a scanner, or any combination thereof. Examples of output devices 110 are a monitor of any type and a printer; however, output device 110 may take other forms, including a plotter and data files. Any suitable visual display unit, such as a liquid crystal display ("LCD") or cathode ray tube ("CRT") display, that allows user 114 to view model 118, may be a suitable output device 110.

Figure 4B:
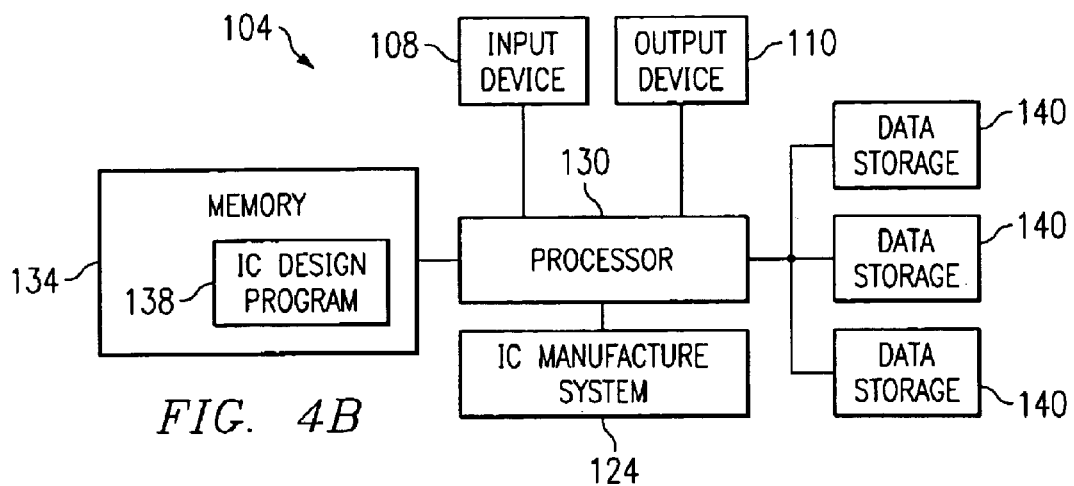
FIG. 4B is a block diagram illustrating one embodiment of the system shown in FIG. 4A.

FIG. 4B is a block diagram of an embodiment of computer 104 for use in design and manufacture of integrated circuit 10. As illustrated, computer 104 includes a processor 130, a memory 134 storing an integrated circuit design software program 138, and one or more data storage units 140 for storing data related to software program 138 or other data.

Processor 130 is coupled to memory 134 and data storage unit 140. Processor 130 is operable to execute the logic of integrated circuit design software program 138 and access data storage unit 140 to retrieve or store data relating to integrated circuit design. Examples of processor 130 are the Pentium™ series processors, available from Intel Corporation.

Memory 134 and data storage unit 140 may comprise files, stacks, databases, or other suitable forms of data. Memory 134 and data storage unit 140 may be random-access memory, read-only memory, CD-ROM, removable memory devices, or any other suitable devices that allow storage and/or retrieval of data. Memory 134 and data storage unit 140 may be interchangeable and may perform the same functions.

Integrated circuit design software program 138 is a computer program that allows user 114 to model an integrated circuit, such as integrated circuit 10. Integrated circuit design software program 138 may reside in any storage medium, such as memory 134 or data storage unit 140. Although FIG. 4B shows program 138 as a software program, program 138 may also be programmed in a variety of hardware, such as a digital signal processor, ASIC, or other suitable hardware. "Software program" is used herein as a phrase to refer to any type of program. Integrated circuit design software program 138 may be written in any suitable computer language, including C or C++. Software program 138 is operable to allow user 114 to select certain models of cells 14 as either low power cells 18 or high performance cells 20. In some embodiments, software program 138 is operable to automatically select certain models of cells 14 from a library as either low power cells 18 or high performance cells 20 depending on whether cell 14 is on a critical path; however, other design criteria may be used to make the automatic selection of certain cells 14. An example software program 138 that may incorporate the teachings of the invention is Artisan™, available from Cadence Design Systems, Inc.

Figure 5:
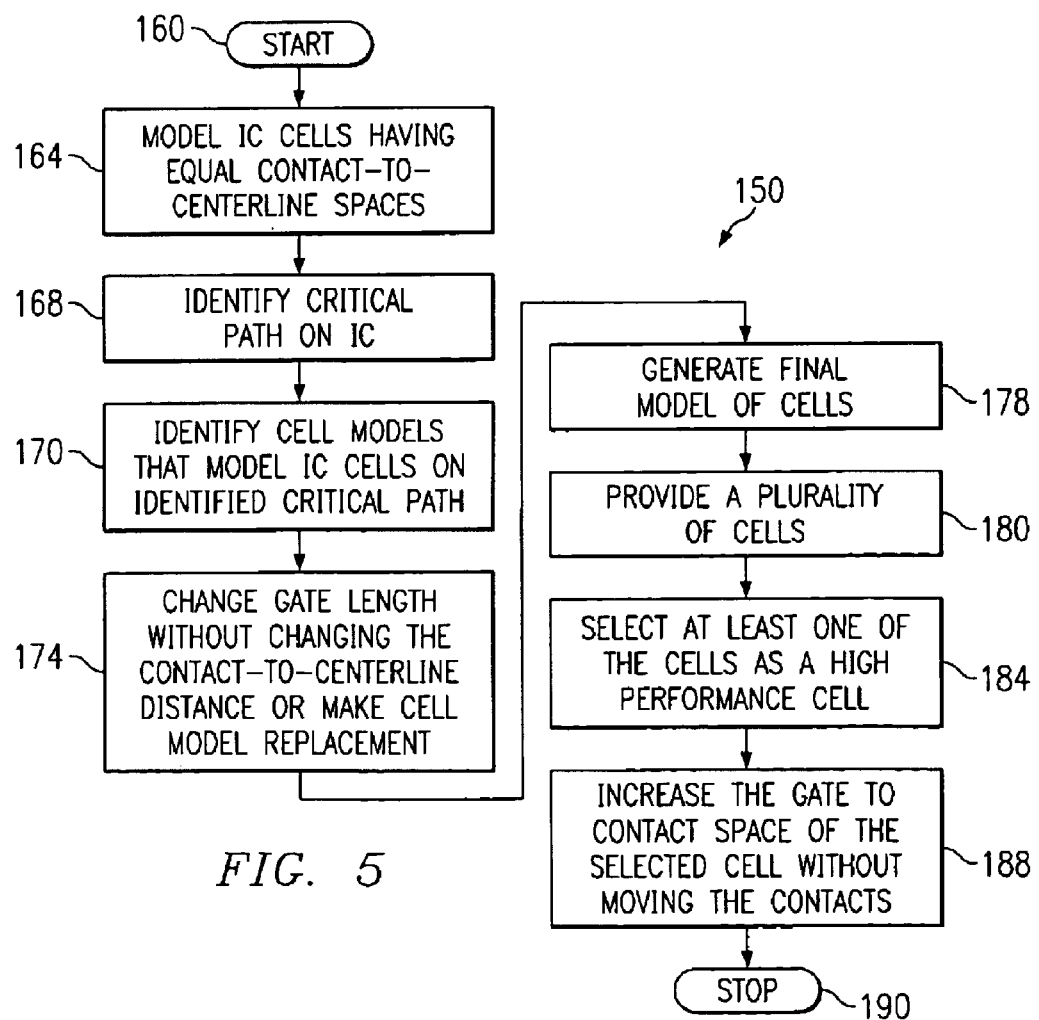
FIG. 5 is a flowchart of one embodiment of a method for designing and manufacturing the integrated circuit of FIG. 1.

FIG. 5 is a flowchart illustrating one embodiment of a method 150 for designing and manufacturing an integrated circuit, such as integrated circuit 10. Method 150 may be implemented using system 100. Method may also be programmed as software program 138. Software program 138 is operable to perform method 150 when executed by any suitable computer. Method 150 starts at step 160. At step 164, a plurality of integrated circuit cells 14 are modeled. In one embodiment, cells 14 may be modeled using a system 100 shown in FIGS. 4A and 4B. Cells 14 are modeled as having an equal contact-to-centerline space 34. In one embodiment, all cells 14 are modeled as low power cells 18. In another embodiment, all cells 14 are modeled as high performance cells 20. At step 168, at least one critical path (not explicitly shown) on integrated circuit 10 is identified. At step 170, cell models that are modeling cells 14 that are on the identified critical path are identified. In some embodiments, steps 168 and 170 may be modified to identify cell models based on other predetermined design criteria of integrated circuit 10; the predetermined criteria for identifying a cell model may be based on the layout of critical paths or other design considerations. At step 174, gate length 30 and/or 32 of identified cell 14 is modified without changing contact-to-centerline distances 34. In an embodiment where all cells 14 are modeled as low performance cells 18 at step 164, gate-to-contact spaces 38 and 40 are increased by reducing gate length 30 to equal gate length 44. In an embodiment where all cells 14 are modeled at high performance cell 20 at step 164, gate lengths 44 of those cells that are not identified as being on the identified critical path at step 170 are increased by lengthening gate lengths 44 to equal respective gate lengths 30. At step 178, a final model of integrated circuit 10 is generated.

In one embodiment, processor 130 of computer 104 directs integrated circuit manufacturing system 124 over link 120 to manufacture integrated circuit 10 using the generated final model. At step 180, cells 14 having the same function and substantially the same footprint are provided. Of the provided cells 14, some cells 14 are selected as high performance cells according to the final model that was generated at step 178. At step 188, gate-to-contact spaces 38 and 40 are increased by decreasing gate length 30 to gate length 44. Method 150 concludes at step 190.

Method, apparatus, and system described in detail above allow the combination of low power cells 18 and high performance cells 20 using the same footprint. This is advantageous in some embodiments of the invention because of layout restrictions in certain integrated circuits, such as an ASIC. According to another embodiment, the process of switching a high performance to a low power cell or vice versa is simplified. According to another embodiment, the use of low power cells decreases overall power consumption level of certain integrated circuits, such as ASIC. Not all embodiments benefit from these advantages. Some embodiments of the invention benefit from some, none, or all of the advantages.

Although some embodiments of the present invention have been described in detail, it should be understood that various changes, substitutions, and alterations can be made hereto without departing from the spirit and scope of the invention as defined by the appended claims.

What is claimed is:

1. An apparatus comprising:
   an integrated circuit comprising a first logic path and a second logic path;
   a first transistor having at least two contacts, a first gate length, and a first gate centerline-to-contact spacing, the first transistor positioned on the first logic path; and
   a second transistor having at least two contacts, a second gate length that is greater than the first gate length, and a second gate centerline-to-contact spacing that is substantially equal to the fast gate centerline-to-contact spacing, the second transistor positioned on the second logic path;
   wherein the difference between the first gate length and the second gate length is smaller than a length of a grid of a design rule for the placement of contacts in the integrated circuit.

2. The apparatus of claim 1, wherein the second logic path comprises a path delay that is less than a critical path delay of the integrated circuit.

3. The apparatus of claim 1, wherein the integrated circuit is an application specific integrated circuit.

4. The apparatus of claim 1, wherein the integrated circuit comprises one or more power grids, each of the one or more power grids having a uniform power grid spacing, and wherein the first transistor and the second transistor are in the one or more power grids.

5. The apparatus of claim 1, wherein the first logic path is a critical path.

6. An apparatus comprising:

an integrated circuit comprising a first logic path and a second logic path;

a first cell having a first cell transistor, the first cell transistor having at least two contacts, a first gate length, and a first gate centerline-to-contact spacing, the first cell transistor positioned on the first logic path; and a second cell having a second cell transistor, the second cell transistor having at least two contacts, a second gate length that is greater than the first gate length, and a second gate centerline-to-contact spacing that is substantially equal to the first gate centerline-to-contact spacing, the second cell transistor positioned on the second logic path;

wherein a footprint of the contacts of the first cell is substantially equal to a footprint of the contacts of the second cell.

7. The apparatus of claim 6, wherein the integrated circuit is an application specific integrated circuit.

8. The apparatus of claim 6, wherein the integrated circuit comprises one or more power grids, each of the one or more power grids having a uniform power grid spacing.

9. The apparatus of claim 6, wherein the difference between the first gate length and the second gate length is smaller than a length of a grid of a design rule for the placement of contacts in the integrated circuit.

* * * * *